United States Patent [19]

Ovshinsky et al.

[11] Patent Number: 4,664,937

[45] Date of Patent: May 12, 1987

[54] METHOD OF DEPOSITING SEMICONDUCTOR FILMS BY FREE RADICAL GENERATION

[75] Inventors: Stanford R. Ovshinsky, Bloomfield Hills; David D. Allred, Troy; Lee Walter, Bloomfield Hills; Stephen J. Hudgens, Southfield, all of Mich.

[73] Assignee: Energy Conversion Devices, Inc., Troy, Mich.

[21] Appl. No.: 854,247

[22] Filed: Apr. 21, 1986

Related U.S. Application Data

[63] Continuation of Ser. No. 725,616, Apr. 22, 1985, Pat. No. 4,615,905, which is a continuation of Ser. No. 423,424, Sep. 29, 1982, Pat. No. 4,517,223.

[51] Int. Cl.⁴ .............................................. C23C 11/02
[52] U.S. Cl. ........................................ 427/39; 427/86
[58] Field of Search .................... 427/38, 39, 45.1, 85, 427/86; 204/164

[56] References Cited

U.S. PATENT DOCUMENTS

| | | | |
|---|---|---|---|
| 4,226,898 | 10/1980 | Ovshinsky et al. | 427/39 |
| 4,363,828 | 12/1982 | Broosky et al. | 427/86 |
| 4,401,054 | 8/1983 | Matsuo et al. | 427/45.1 |

FOREIGN PATENT DOCUMENTS 2033355 5/1980 United Kingdom ................. 427/39

Primary Examiner—John H. Newsome
Attorney, Agent, or Firm—Marvin S. Siskind; Richard M. Goldman

[57] ABSTRACT

A method of depositing a semiconductor alloy film onto a substrate by activating at least one group of free radicals and incorporating desired ones of the activated group into the film.

23 Claims, 10 Drawing Figures

METHOD OF DEPOSITING SEMICONDUCTOR FILMS BY FREE RADICAL GENERATION

CROSS REFERENCE TO RELATED APPLICATION

This application is a continuation of U.S. application Ser. No. 725,616 filed Apr. 22, 1985, now U.S. Pat. No. 4,615,905 which is a continuation of U.S. application Ser. No. 423,424 filed Sept. 29, 1982, now U.S. Pat. No. 4,517,223 issued May 14, 1985.

BACKGROUND OF THE INVENTION

This invention relates to a method of making amorphous semiconductor alloys having improved photoresponsive characteristics and devices made therefrom. The invention more particularly relates to a method of making such alloys and devices by plasma deposition from reaction gases wherein the plasmas are excited by microwave energy. The invention has its most important application in making improved photoresponsive alloys and devices for various photoresponsive applications including photoreceptive devices such as solar cells of a p-i-n, p-n, Schottky or MIS (metal-insulator-semiconductor) type; photoconducting medium such as utilized in xerography; photodetecting devices and photodiodes including large area photodiode arrays.

Silicon is the basis of the huge crystalline semiconductor industry and is the material which has produced expensive high efficiency (18 percent) crystalline solar cells for space applications. When crystalline semiconductor technology reached a commercial state, it became the foundation of the present huge semiconductor device manufacturing industry. This was due to the ability of the scientist to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extermely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material have all resulted in an impossible economic barrier to the large scale use of the crystalline semiconductor solar cells for energy conversion. Further, crystalline silicon has an indirect optical edge which results in poor light absorption in the material. Because of the poor light absorption, crystalline solar cells have to be at least 50 microns thick to absorb the incident sunlight. Even if the single crystal material is replaced by polycrystalline silicon with cheaper production processes, the indirect optical edge is still maintained; hence the material thickness is not reduced. The polycrystalline material also involves the addition of grain boundaries and other problem defects.

In summary, crystal silicon devices have fixed parameters which are not variable as desired, require large amounts of material, are only producible in relatively small areas and are expensive and time consuming to produce. Devices based upon amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster, easier in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in Solid State Communications, Vol. 17, pp. 1193–1196, 1975, toward the end of reducing the localized states in the energy gap in amorphous silicon or germanium to make the same approximate more closely intrinsic crystalline silicon or germanium and or substitutionally doping the amorphous materials with suitable classic dopants, as in doping crystalline materials, to make them extrinsic and or p or n conduction types.

The reduction of the localized states was accomplished by glow discharge deposition of amorphous silicon films wherein a gas of silane ($SiH_4$) was passed through a reaction tube where the gas was decomposed by an r.f. glow discharge and deposited on a substrate at a substrate temperature of about 500°–600° K. (227°–327° C.). The material so deposited on the substrate was an intrinsic amorphous material consisting of silicon and hydrogen. To produce a doped amorphous material a gas of phosphine ($PH_3$) for n-type conduction or a gas of diborane ($B_2H_6$) for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited including supposedly substitutional phosphorus or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the electronic properties of the amorphous material approximate more nearly those of the corresponding crystalline material.

The incorporation of hydrogen in the above method not only has limitations based upon the fixed ratio of hydrogen to silicon in silane, but, more importantly, various Si:H bonding configurations introduce new antibonding states which can have deleterious consequences in these materials. Therefore, there are basic limitations in reducing the density of localized states in these materials which are particularly harmful in terms of effective p as well as n doping. The resulting density of states of the silane deposited materials leads to a narrow depletion width, which in turn limits the efficiencies of solar cells and other devices whose operation depends on the drift of free carriers. The method of making these materials by the use of only silicon and hydrogen also results in a high density of surface states which affects all the above parameters.

After the development of the glow discharge deposition of silicon from silane gas was carried out, work was done on the sputter depositing of amorphous silicon films in the atmosphere of a mixture of argon (required by the sputtering deposition process) and molecular hydrogen, to determine the results of such molecular hydrogen on the characteristics of the deposited amorphous silicon film. This research indicated that the hydrogen acted as an altering agent which bonded in such a way as to reduce the localized states in the energy gap. However, the degree to which the localized states in the energy gap were reduced in the sputter deposition process was much less than that achieved by the silane deposition process described above. The above described p and n dopant gases also were introduced in the sputtering process to produce p and n doped materials. These materials had a lower doping efficiency than the materials produced in the glow discharge process. Neither process produced efficient p-doped materials with sufficiently high acceptor concentrations for producing commercial p-n or p-i-n junction devices. The n-doping efficiency was below desirable acceptable commercial levels and the p-doping was particularly undesirable since it reduced the width of the band gap and increased the number of localized states in the band gap.

The prior deposition of amorphous silicon, which has been altered by hydrogen from the silane gas in an attempt to make it more closely resemble crystalline silicon and which has been doped in a manner like that of doping crystalline silicon, has characteristics which in all important respects are inferior to those of doped crystalline silicon. Thus, inadequate doping efficiencies and conductivity were achieved especially in the p-type material, and the photovoltaic qualities of these silicon alloy films left much to be desired.

Greatly improved amorphous silicon alloys having significantly reduced concentrations of localized states in the energy gaps thereof and high quality electronic properties have been prepared by glow discharge as fully described in U.S. Pat. No. 4,226,898, Amorphous Semiconductors Equivalent to Crystalline Semiconductors, Stanford R. Ovshinsky and Arun Madan which issued Oct. 7, 1980, and by vapor deposition as fully described in U.S. Pat. No. 4,217,374, Stanford R. Ovshinsky and Masatsugu Izu, which issued on Aug. 12, 1980, under the same title. As disclosed in these patents, which are incorporated herein by reference, fluorine is introduced into the amorphous silicon semiconductor to substantially reduce the density of localized states therein. Activated fluorine especially readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine is considered to be a more efficient compensating or altering element than hydrogen when employed alone or with hydrogen because of its exceedingly small, size, high reactivity, specificity in chemical bonding, and highest electronegativity. Hence, fluorine is qualitatively different from other halogens and so is considered a super-halogen.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogenfluorine alloy. Such alloying amounts of fluorine and hydrogen may, for example, be in the range of 1 to 5 percent or greater. It is believed that the new alloy so formed has a low density defect states in the energy gap than that achieved by the mere neutralization of dangling bonds and similar defect states. Such larger amount of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen contributes while acting as a density of states reducing element. The ionic role that fluorine plays in such an alloy is believed to be an important factor in terms of the nearest neighbor relationships.

Amorphous semiconductor alloys made by the processes hereinabove described have demonstrated photoresponsive characteristic ideally suited for photovoltaic applications. These prior art processes however have suffered from relatively slow deposition rates and low utilization of the reaction gas feed stock which are important considerations from the standpoint of making photovoltaic devices from these materials on a commercial basis. In addition, these processes result in high electron temperature plasmas which produce, during deposition, high densities of ions. The production of these ions results in ion bombardment of the materials or they are being deposited which can result in material damage.

Applicants herein have discovered a new and improved process for making amorphous semiconductor alloys and devices. The inventive process herein provides substantially increased deposition rates and reaction gas feed stock utilization. Further, the process of the present invention results i n depositions from plasmas with lower electron temperatures a nd substantially reduced ion densities and hence, substantially reduced ion bombardment and damage of the deposited materials. Still further, the process of the present invention results in the formation of reactive species not previously obtainable in sufficiently large concentrations with prior art processes. As a result, new amorphous semiconductor alloys can be produced having substantially different material properties than previously obtainable. All of the above results, by virtue of the present invention, in amorphous semiconductor alloys and devices made therefrom having improved photoresponsive characteristics while being made at substantially increased rates.

As disclosed in the aforementioned referenced U.S. Pat. No. 4,217,374, new and improved amorphous semiconductor alloys and devices can be made which are stable and composed of chemical configurations which are determined by basic bonding considerations. One of these considerations is that the material is as tetrahedrally bonded as possible to permit minimal distortion of the material without long range order. Fluorine, for example, when incorporated into these alloy materials, performs the function of promoting tetrahedral bonding configurations. Amorphous semiconductor materials having such tetrahedral structure exhibit low densities of dangling bonds making the materials suitable for photovoltaic applications.

Hydrogen, while smaller than fluorine, is by far less reactive. Hydrogen, as a result, in addition to promoting tetrahedral bonding, also promotes other various possible bonding configurations which can introduce defects into the material. For example, H₂Si bonds are possible. These bonds are weak bonds which can thermally be broken leaving behind dangling bonds. Also, hydrogen requires rather precise substrate temperature control during deposition to promote the preferred tetrahedral bonding. Therefore, hydrogen in small amounts, in conjunction with fluorine in small amounts should make the optimal amorphous semiconductor alloy. It is not hydrogen as a molecule or fluorine as a molecule, however, which is able to perform these functions. It is atomic hydrogen and atomic fluorine which does. From a chemical point of view in the plasma these species exist as free atoms or free radicals.

In accordance with one preferred embodiment, atomic fluorine and/or hydrogen are generated separately as free radicals and reacted with semiconductor free radicals generated within a plasma sustained by microwave energy. As a result, all of the advantages of separate free radical formation are obtained along with all of the advantages of microwave plasma deposition.

In making a commercial photovoltaic device, it is necessary to provide environmental encapsulation of the devices to prevent undesireable chemical reactions within the device materials due to exposure to chemical species contained in the environment. For example, oxidation of contact materials must be prevented. Customarily, relatively heavy and thick materials such as glass or various organic polymer or plastic materials have been proposed to provide such protection. In accordance with a further embodiment of the present invention, such protection is provided which not only provides the required encapsulation, but additionally light in weight and can be easily incorporated in a manner compatible with the formation of the photovoltaic materials of the devices.

SUMMARY OF THE INVENTION

The present invention provides a process for making amorphous semiconductor alloy films and devices at substantially higher rates than possible in the prior art. Even though deposition occurs at the higher rates, the alloys exhibit high quality electronic properties suitable for many applications including photovoltaic applications.

In accordance with the invention, the process includes the steps of providing a source of microwave energy, coupling the microwave energy into a substantially enclosed reaction vessel containing the substrate onto which the amorphous semiconductor film is to be deposited, and introducing into the vessel reaction gases including at least one semiconductor containing compound. The microwave energy and the reaction gases form a glow discharge plasma within the vessel to deposit an amorphous semiconductor film from the reaction gases onto the substrate. The reactions gases can include silane ($SiH_4$), silicon tetrafluoride ($SiF_4$), silane and silicon tetrafluoride, silane and germane ($GeH_4$), or silicon tetrafluoride and germane. The reaction gases can also include germane or germanium tetrafluoride ($GeF_4$). To all of the foregoing, hydrogen ($H_2$) can also be added. Dopants, either p-type or n-type can also be added to the reaction gases to form p-type or n-type alloy films, respectively. Also, band gap increasing elements such as carbon or nitrogen can be added in the form of, for example, methane or ammonia gas to widen the band gap of the alloys.

Independent control over all of the deposition parameters can be obtained by separately generating the free radical species prior to combination in the microwave plasma. For example, atomic fluorine and/or hydrogen can be separately generated and fed into the plasma wherein the semiconductor free radicals are generated. The foregoing thereafter react in the plasma and are deposited onto the substrate to form new and improved amorphous semiconductor alloys. The semiconductor free radicals can be generated from any of the semiconductor containing compounds previously mentioned.

Also, encapsulation of the photovoltaic devices is obtained by deposition, a relatively thin layer of transparent insulating materials over the devices. For example, the transparent materials can comprise silicon nitride ($Si_3N_4$) or silicon dioxide ($SiO_2$) formed for example by the microwave glow discharge of silane and ammonia or nitrogen and silane and oxygen respectively.

DESCRIPTION OF THE PREFERRED EMBODIMENTS

Figure 1:
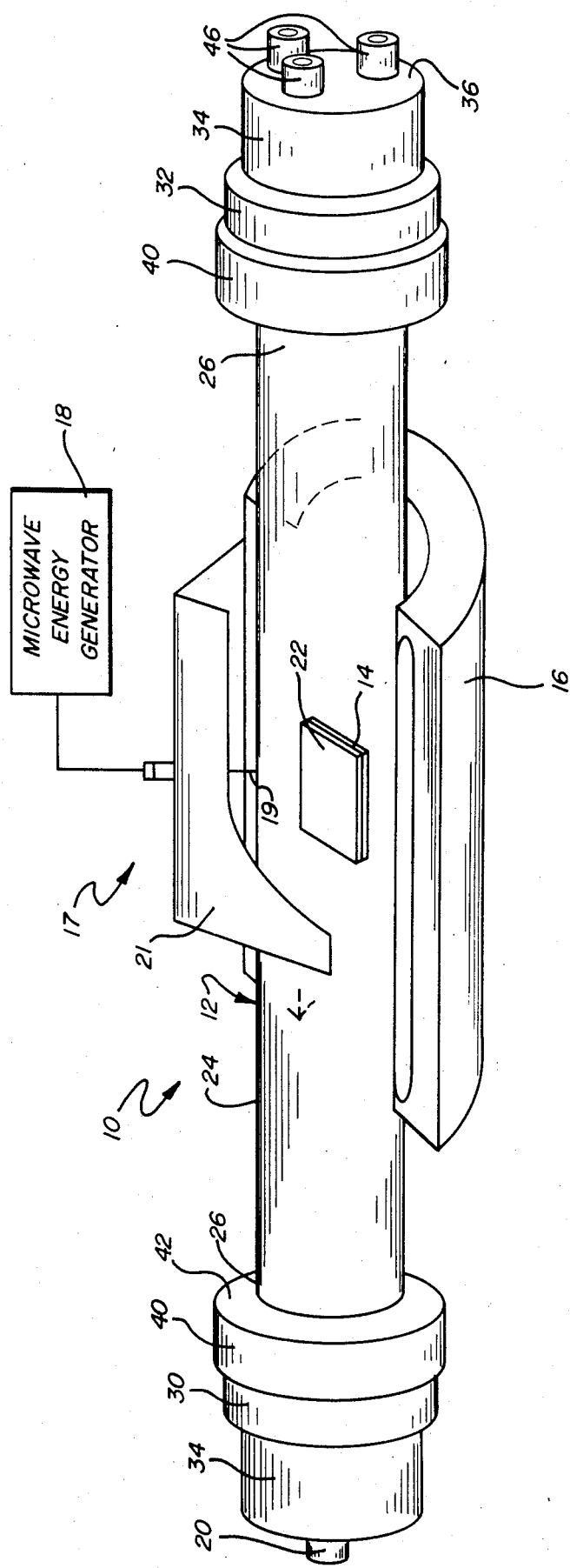
FIG. 1 is a perspective view, partly broken away, of a microwave plasma deposition system for depositing amorphous semicondcutor alloy films in accordance with the process of the invention.

Referring now more particularly to FIG. 1, a microwave deposition apparatus suitable for practicing the process of the present invention, is generally designated 10. The apparatus 10 comprises a transparent tubular chamber or vessel 12 containing a substrate 14 upon which the amorphous semiconductor alloy films are to be deposited. The substrate is heated by a radiant heater 16 and the exterior of the chamber is irradiated by a microwave energy source 17. Reaction gases passing from inlets 46 to an outlet 20 at opposite ends of the chamber 12 receive microwave energy from the source 17 in the area of the substrate. The combination of the reaction gases and the microwave energy from source 17 causes the formation of a plasma in the area of the substrate, resulting in the deposition of a film 22. In accordance with the present invention, the reaction gases include at least one semiconductor containing compound to form the plasma. The temperature of the substrate can be between room temperature and about 400 degrees Centigrade and the frequency of the microwave energy can be 2.45 Gigahertz and above and preferably 2.45 Gigahertz. As mentioned, the combined microwave energy and the reaction gases form the plasma to permit the deposition process to proceed. During the process, the film 22 is spared from the damaging effects of ion bombardment because of the relatively low ion concentration in the plasma and reduced substrate self bias.

Referring now to FIG. 1 in greater detail, the tubular chamber 12 comprises a central quartz portion 24 and end portions 26 at opposite ends thereof. The end portions 26 are closed by a pair of end fittings 30 and 32 to complete the chamber. Each of the end fittings includes a sleeve portion 34 extending from a closed end 36 to an open end portion. The open end portion is threaded to receive a collar 40 having an inwardly extending annular flange 42 at one end thereof. An o-ring (not shown) is confined in a space between the flange 42 and the end portion for compression thereof against the quartz portion 26. An air-tight seal is provided in this way between the end fittings 30 and 32 and the tubular chamber 12.

The end fittings 30 and 32 are preferably made of stainless steel or other suitable noncorrosive metal, with the closed ends 36 being welded or otherwise permanently joined to the sleeve portions 34. The closed end 36 of the end fitting 32 is provided with gas inlets 46 through which the deposition gases are introduced into the vessel 12. An inert gas such as argon can be introduced through one inlet 46 to assist in sustaining the plasma.

The gas inlets 46 are preferably connected to a conventional gas rack (not shown) for establishing regulated flows of reaction gases therein. The outlet 20 is provided at the closed end 36 to the end fitting 30 for connection to selectable first and second pumps. The first pump provides for initial evacuation of the chamber. The second pump provides withdrawal of unused reaction gases during operation and maintenance of the proper deposition pressure of 0.1 Torr or greater.

The microwave energy source 17 preferably comprises a microwave energy generator 18 coupled to an antenna 19. The antenna 19 is housed within a reflective housing 21 for concentration of the microwave energy into the chamber 12. The antenna as illustrated is a vertical antenna being preferably one-quarter wavelength long. The tip of the antenna just touches the outer surface of the vessel 12 to maximize transmission of its output to the reaction gases.

The radiant heater 16 preferably comprises a conventional resistive heater. Heat is transmitted to the substrate 14 and the chamber 12 by radiation, without significant direct heating of the reaction gases. Alternatively, a resistive heating arrangement (not shown) may be provided within the chamber 12 for heating the substrate 14. In that case, power lines for the heating element would be passed through the closed end 36 of one of the end fittings.

In operation, the system 10 is first pumped down to below a desired deposition pressure, such as $10^{-5}$ Torr. The reaction gases such as silicon tetrafluoride ($SiF_4$), silane ($SiH_4$), silicon tetrafluoride and silane, silane and germane ($GeH_4$), or silicon tetrafluoride and germane are fed into the inlet chamber 24 through separate inlet conduits 46 and chamber 12 is brought up to the desired operating pressure of, for example, 0.1 Torr. To the foregoing reaction gases, hydrogen ($H_2$) can also be added. Other reaction gases which can be utilized are germane, germanium tetrafluoride ($GeF_4$), germanium tetrafluoride and silicon tetrafluoride. Hydrogen ($H_2$) can also be added to these gases.

The microwave energy from the antenna 19 is directed by the reflective housing 21 into the vessel 12 to form a plasma in the area of the substrate. As a result, an amorphous semiconductor alloy film 22 is deposited onto the substrate 14. The heater 16 maintains the substrate at a temperature between about 20° Centigrade and 400° Centigrade. The output power of the microwave energy generator 18 is adjusted between about 20 and 115 watts depending on the volume of the gas contained in the plasma and the composition of the gas. These power outputs preferably correlate to about 0.1 to 1 watt per cubic centimeter in power density. The flow rate of the reaction gases can be between 1 to 10 SCCM. With the foregoing system parameters, deposition rates of 25 Å to 250 Å per second can be obtained. Even at these high deposition rates, the deposited amorphous semiconductor films exhibit high quality photoresponsive characteristics suitable for photovoltaic and other applications.

For making photovoltaic devices by the process of the invention, dopants can be introduced into the vessel 12 for making the deposited film either p-type or n-type. For example, to make a p-type film, diborane gas ($B_2H_6$) can be introduced through one of the inlets 46. For making n-type films, phosphine gas ($PH_3$) can be introduced into one of the inlets 46. If it is desired to increase the band gap of a material, band gap increasing elements such as carbon or nitrogen can be incorporated into the films by introducing methane ($CH_4$) or ammonia ($NH_3$) into one of the inlets 46 during deposition. The reaction gases can be sequentially introduced to result in the formation of any desired device configuration.

To assist in the maintenance of the plasma, a plasma sustaining gas can be introduced into one of the inlets 46. Argon gas can be utilized for this purpose. The deposition of amorphous semiconductor alloy films by the foregoing inventive process has demonstrated many advantages over prior deposition processes. Firstly, the microwave energy provides a higher density of free radicals than previously possible. This results in higher deposition rates, nearly total utilization of the feed stock reaction gases and enhanced reactivity of plasma species leading to incorporation in the growing film of elements which previously could not be so incorporated. This results in new materials having unique compositional and structural properties. Secondly, the plasma formed has a lower electron temperature. This results in substantially lower ion formation. Ion formation is believed to be deleterious to high quality film deposition due to excessive bombardment of the film particularly by charged particles such as electron by the ions. Such ion bombardment damages the material as it is deposited. In summary, the invention provides a process for making amorphous semiconductor films and devices which have higher deposition, rates, improved properties and which affords wide variations in the material compositions.

Figure 2:
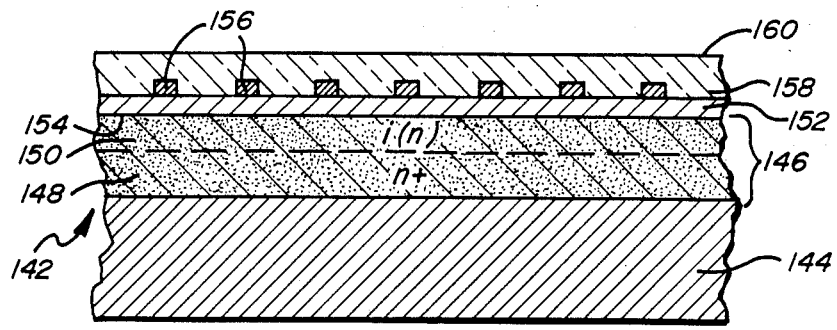
FIG. 2 is a fragmentary sectional view of an embodiment of a Schottky barrier solar cell to illustrate one application of the amorphous semiconductor photoreceptive alloys made by the process of the invention.
Figure 3:
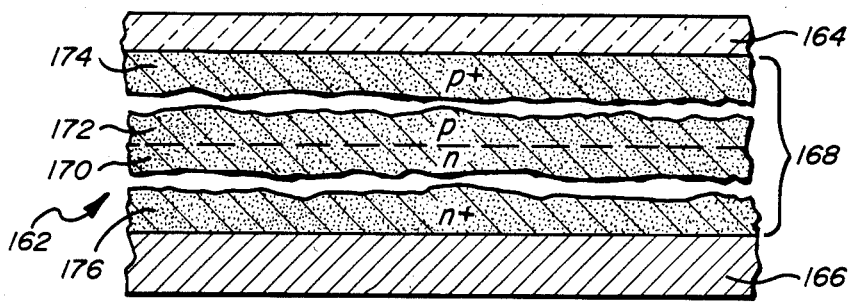
FIG. 3 is a fragmentary sectional view of a p-n junction solar cell device which includes a doped amorphous semiconductor alloy made by the process of the invention.

Various applications of the improved amorphous alloys produced by the unique processes of the invention are illustrated in FIGS. 2 through 7. FIG. 2 shows a Schottky barrier solar cell 142 in fragmentary cross-section. The solar cell 142 includes a substrate or electrode 144 of a material having good electrical conductivity properties, and the ability of making an ohmic contact with an amorphous alloy 146 compensated or altered to provide a low density of localized states in the energy gap. The substrate 144 may comprise a low work function metal, such as aluminum, tantalum, stainless steel or other material matching with the amorphous alloy 146 deposited thereon which preferably includes silicon, compensated or altered in the manner of the alloys previously described so that it has a low density of localized states in the energy gap of preferably no more than $10^{16}$ per cubic centimeter per eV. It is most preferred that the alloy have a region 148 next to the electrode 144, which region forms an n-plus conductivity, heavily doped, low resistance interface between the electrode and an undoped relatively high dark resistance region 150 which is an intrinsic, but low n-conductivity region.

The upper surface of the amorphous alloy 146 as viewed in FIG. 2, joins a metallic region 152, an interface between this metallic region and the amorphous alloy 146 forming a Schottky barrier 154. The metallic region 152 is transparent or semi-transparent to solar radiation, has good electrical conductivity and is of a high work function (for example, 4.5 eV or greater, produced, for example, by gold, platinum, palladium, etc.) relative to that of the amorphous alloy 146. The metallic region 152 may be a single layer of a metal or it may be a multi-layer. The amorphous alloy 146 may have a thickness of about 0.5 to 1 micron and the metallic region 152 may have a thickness of about 100 Å in order to be semi-transparent to solar radiation.

On the surface of the metallic region 152 is deposited a grid electrode 156 made of a metal having good electrical conductivity. The grid may comprise orthogonally related lines on conductive material occupying only a minor portion of the area of the metallic region, the rest of which is to be exposed to solar energy. For example, the grid 156 may occupy only about from 5 to 10% of the entire area of the metallic region 152. The grid electrode 156 uniformly collects current from the metallic region 152 to assure a good low series resistance for the device.

An anti-reflection layer 158 may be applied over the grid electrode 156 and the areas of the metallic region 152 between the grid electrode areas. The anti-reflection layer 158 has a solar radiation incident surface 160 upon which impinges the solar radiation. For example, the anti-reflection layer 158 may have a thickness on the order of magnitude of the wavelength of the maximum energy point of the solar radiation spectrum, divided by four times the index of refraction of the anti-reflection layer 158. If the metallic region 152 is platinum of 100 Å in thickness, a suitable anti-reflection layer 158 would be zirconium oxide of about 500 Å in thickness with an index of refraction of 2.1.

The Schottky barrier 154 formed at the interface between the regions 150 and 152 enables the photons from the solar radiation to produce current carriers in the alloy 146, which are collected as current by the grid electrode 156. An oxide layer (not shown) can be added between the layers 150 and 152 to produce an MIS (metal insulator semiconductor) solar cell.

In addition to the Schottky barrier or MIS solar cell shown in FIG. 2, there are solar cell constructions which utilize p-n junctions in the body of the amorphous alloy forming a part thereof formed in accordance with successive deposition, compensating or altering and doping steps like that previously described. These other forms of solar cells are generically illustrated in FIG. 3 as well as in FIGS. 6 and 7.

These constructions 162 generally include a transparent electrode 164 through which the solar radiation energy penetrates into the body of the solar cell involved. Between this transparent electrode and an opposite electrode 166 is a deposited amorphous alloy 168, preferably including silicon, initially compensated in the manner previously described. In this amorphous alloy 168 are at least two adjacent regions 170 and 172 where the amorphous alloy has respectively oppositely doped regions, region 170 being shown as a n-conductivity region and region 172 being shown as a p-conductivity region. The doping of the regions 170 and 172 is only sufficient to move the Fermi levels to the valence and conduction bands involved so that the dark conductivity remains at a low value achieved by the band adjusting and compensating or altering method of the invention. The alloy 168 has high conductivity, highly doped ohmic contact interface regions 174 and 176 of the same conductivity type as the adjacent region of the alloy 168. The alloy regions 174 and 176 contact electrodes 164 and 166, respectively.

Figure 4:
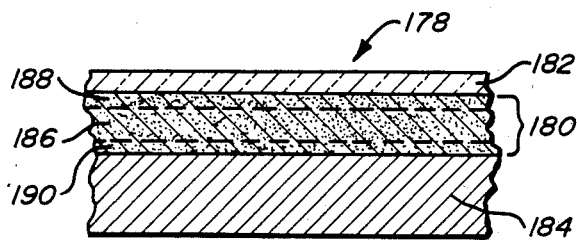
FIG. 4 is a fragmentary sectional view of a photodetection device which includes an amorphous semiconductor alloy made by the process of the invention.

Referring now to FIG. 4, there is illustrated another application of an amorphous alloy utilized in a photodetector device 178 whose resistance varies with the amount of light impinging thereon. An amorphous alloy 180 thereof is deposited in accordance with the invention, has no p-n junctions as in the embodiment shown in FIG. 3 and is located between a transparent electrode 182 and a substrate electrode 184. In a photo-detector device it is desirable to have a minimum dark conductivity and so the amorphous alloy 180 has an undoped, but compensated or altered region 186 and heavily doped regions 188 and 190 of the same conductivity type forming a low resistance ohmic contact with the electrodes 182 and 184, which may form a substrate for the alloy 180.

Figure 5:
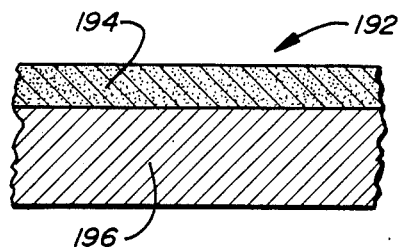
FIG. 5 is a fragmentary sectional view of a xerographic drum including an amorphous semiconductor alloy made by the process of the invention.

Referring to FIG. 5 an electrostatic image producing device 192 (like a xerography drum) is illustrated. The device 192 has a low dark conductivity, selective wavelength threshold, undoped or slightly p-doped amorphous oxygen stabilized alloy 194 deposited on a suitable substrate 196 such as a drum.

As used herein, the terms compensating agents or materials and altering agents, elements or materials mean materials which are incorporated in the amorphous alloy for altering or changing the structure thereof, such as, activated fluorine (and hydrogen) incorporated in the amorphous alloy containing silicon to form an amorphous silicon/fluorine/hydrogen composition alloy, having a low density of localized states in the energy gap. The activated fluorine (and hydrogen) is bonded to the silicon in the alloy and reduces the density of localized states therein and due to the small size of the fluorine and hydrogen atoms they are both readily introduced into the amorphous alloy without substantial dislocation of the silicon atoms and their relationships in the amorphous alloy.

Figure 6:
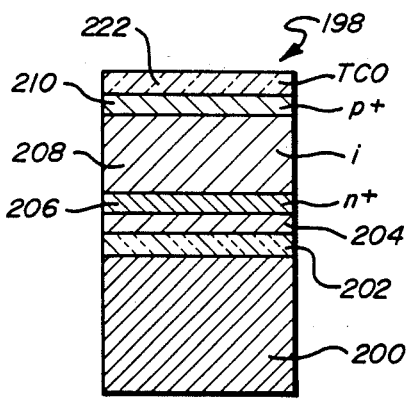
FIG. 6 is a fragmentary sectional view of a p-i-n junction solar cell device.

Referring now to FIG. 6, a p-i-n solar cell 198 is illustrated having a substrate 200 which may be glass or a flexible web formed from stainless steel or aluminum. The substrate 200 is of a width and length as desired and preferably at least 3 mils thick. The substrate has an insulating layer 202 deposited thereon by a conventional process such as chemical deposition, vapor deposition or anodizing in the case of an aluminum substrate. The layer 202 for instance, about 5 microns thick can be made of a metal oxide. For an aluminum substrate, it preferably is aluminum oxide ($Al_2O_3$) and for a stainless steel substrate it may be silicon dioxide ($SiO_2$) or other suitable glass.

An electrode 204 is deposited in one or more layers upon the layer 202 to form a base electrode for the cell 198. The electrode 204 layer or layers is deposited by vapor deposition, which is a relatively fast deposition process. The electrode layers preferably are reflective metal electrodes of molybdenum, aluminum, chrome or stainless steel for a solar cell or a photovoltaic device. The reflective electrode is preferably since, in a solar cell, non-absorbed light which passes through the semiconductor alloy is reflected from the electrode layers 204 where it again passes through the semiconductor alloy which then absorbs more of the light energy to increase the device efficiency.

Figure 7:
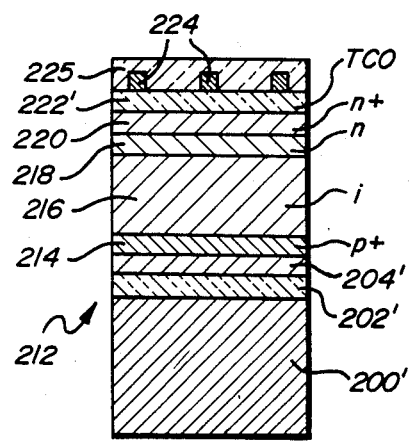
FIG. 7 is a fragmentary sectional view of a n-i-p junction solar cell device.

The substrate 200 is then placed in the deposition environment. The specific examples shown in FIGS. 6 and 7 are only illustrative of some p i-n junction devices which can be manufactured utilizing the improved process of the invention. For example, tandem cells can also be made by the process of the present invention. Each of the devices illustrated in FIGS. 6 and 7, has an alloy body having an overall thickness of between about 3,000 and 30,000 angstroms. This thickness ensures that there are no pin holes or other physical defects in the structure and that there is maximum light absorption efficiency. A thicker material may absorb more light, but at some thickness will not generate more current since the greater thickness allows more recombination of the light generated electron-hole pairs. (It should be understood that the thicknesses of the various layers shown in FIGS. 2 through 7 are not drawn to scale.)

Referring first to forming the n-i-p device 198, the device is formed by first depositing a heavily doped n+ alloy layer 206 on the electrode 204. Once the n+ layer 206 is deposited, an intrinsic (i) alloy layer 208 is deposited thereon. The intrinsic layer 208 is followed by a highly doped conductive p+ alloy layer 210 deposited as the final semiconductor layer. The amorphous alloy layers 206, 208 and 210 form the active layers of the n-i-p device 198.

While each of the devices illustrated in FIGS. 6 and 7 may have other utilities, they will be now described as photovoltaic devices. Utilized as a photovoltaic device, the selected outer, p+ layer 210 is a low light absorption, high conductivity alloy layer. The intrinsic alloy layer 208 preferably has an adjusted wavelength threshold for a solar photoresponse, high light absorption, low dark conductivity and high photoconductivity. The bottom alloy layer 204 is a low light absorption, high conductivity n+ layer. The overall device thickness between the inner surface of the electrode layer 206 and the top surface of the p+ layer 210 is, as stated previously, on the order of at least about 3,000 angstroms. The thickness of the n+ doped layer 206 is preferably in the range of about 50 to 500 angstroms. The thickness of the amorphous intrinsic alloy 208 is preferably between about 3,000 angstroms to 30,000 angstroms. The thickness of the top p+ contact layer 210 also is preferably between about 50 to 500 angstroms. Due to the shorter diffusion length of the holes, the p+ layer generally will be as thin as possible on the order of 50 to 150 angstroms. Further, the outer layer (here p+ layer 210) whether n+ or, p+ will be kept as thin as possible to avoid absorption of light in the contact layer.

A second type of p-i-n junction device 212 is illustrated in FIG. 7. In this device a first p+ layer 214 is deposited on the electrode layer 204' followed by an intrinsic amorphous alloy layer 216, an n amorphous alloy layer 218 and an outer n+ amorphous alloy layer 220. Further, although the intrinsic alloy layer 208 or 216 (in FIGS. 6 and 7) is an amorphous alloy, the other layers are not so restricted and could, for instance, be polycrystalline, such as layer 214. (The inverse of the FIGS. 6 and 7 structure not illustrated, also can be utilized.)

Following the deposition of the various semiconductor alloy layers in the desired order for the devices 198 and 212, a further deposition step is performed, preferably in a separate deposition environment. Desirably, a vapor deposition environment is utilized since it is a fast deposition process. In this step, a TCO layer 222 (transparent conductive oxide) is added which, for example, may be indium tin oxide (ITO), cadmium stannate ($Cd_2SnO_4$), or doped tin oxide ($SnO_2$). The TCO layer will be added following the post compensation of fluorine (and hydrogen) if the films were not deposited with one or more of the desired compensating or altering elements therein. Also, the other compensating or altering elements, above described, can be added by post compensation.

An electrode grid 224 can be added to either of the device 198 or 212 if desired. For a device having a sufficiently small area, the TCO layer 222 is generally sufficiently conductive such that the grid 224 is not necessary for good device efficiency. If the device is of a sufficiently large area or if the conductivity of the TCO layer 222 is insufficient, the grid 224 can be placed on the layer 222 to shorten the carrier path and increase the conduction efficiency of the devices.

Lastly, a transparent encapsulant 225 is deposited over the grid 224. This encapsulant can comprise, for example, silicon nitride ($Si_3N_4$) or silicon dioxide ($SiO_2$) formed from the microwave deposition of silane and nitrogen or ammonia or silane and oxygen respectively. The layer 225 or transparent material can have a thickness of about one to fifty microns.

If the layer 225 comprises silicon nitride, the reaction gases can be silane ($SiH_4$) and a mixture of three percent hydrogen and ninty-seven percent nitrogen. The deposition temperature can be room temperature and the deposition pressure can be between 0.7 and 1.5 Torr. The reaction gas flow range can be about 10 SCCM and the between 80 and 100 watts.

Each of the device semiconductor alloy layers can be deposited upon the substrate by the apparatus illustrated in FIG. 1. The vessel 12 initially is evacuated to approximately 0.1 Torr to purge or eliminate impurities in the atmosphere from the deposition system. The alloy material preferably is then fed into the deposition chamber in a compound gaseous form, most advantageously as a semiconductor containing compounds for intrinsic materials. The reactive gas can contain band gap adjusting elements such as germanium to form an intrinsic amorphous semiconductor alloy having a narrowed band gap. The microwave generator is energized and the plasma is obtained from the gas mixture.

The semiconductor material is deposited from the plasma onto the substrate which can be heated to the desired deposition temperature for each alloy layer. For example, the substrate temperature can be 275° C. for amorphous silicon and germanium alloys and 200° C. for amorphous germanium alloys deposited from $GeF_4$ or $GeH_4$. The doped layers of the devices are deposited at various temperatures of for example 250° C. to 300° C. depending upon the form of the material used. The upper limitation on the substrate temperature in part is due to the type of metal substrate utilized. For an initially hydrogen compensated amorphous alloy to be produced, such as to form the intrinsic layer in n-i-p or p-i-n devices, the substrate temperature should be less than about 400° C. and preferably about 275° C.

The doping concentrations are varied to produce the desired p, p+, n or n+ type conductivity as the alloy layers are deposited for each device. For n or p doped layers, the material is doped with 5 to 100 ppm of dopant material as it is deposited. For n+ or p+ doped layers the material is doped with 100 ppm to over 1 percent of dopant material as it is deposited.

Figure 8:
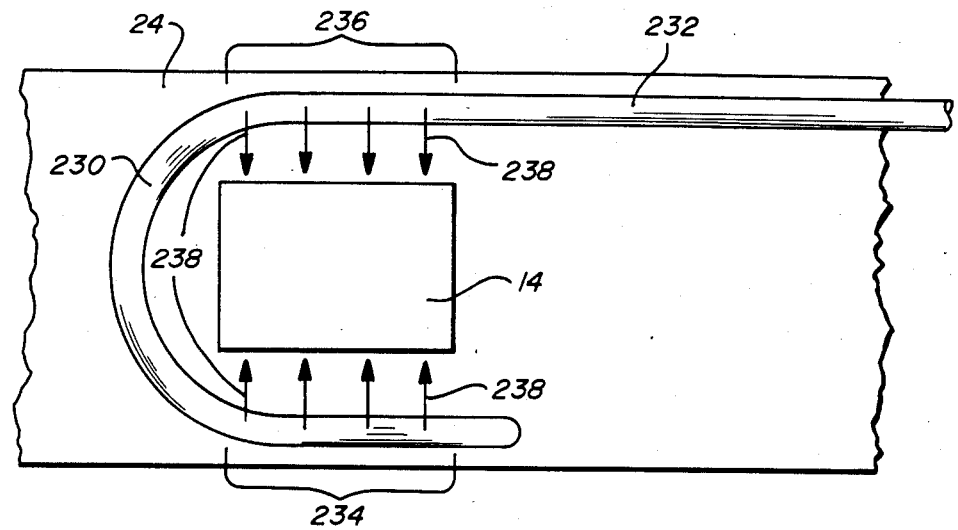
FIG. 8 is a partial top plan view of an alternative gas feed arrangement for the apparatus of FIG. 1 in accordance with a further embodiment of the present invention.

Referring now to FIG. 8, there is illustrated an alternative gas feed system for the apparatus of FIG. 1. The gas feed system includes a gas distribution manifold 230 within the enclosed chamber 24. The manifold 230 has an extension 232 which extends through the chamber end cap (not shown) for receiving the various gas mixtures to be utilized in the microwave plasma. The gas mixtures can be any of gas mixtures previously identified. As can be seen in FIG. 8, the manifold loops around the substrate 14 and includes a plurality of outlets along substantially parallel portions 234 and 236. This allows the reaction gases indicated by arrows 238 to be evenly distributed over the substrates to result in a more uniform plasma. As a result, the amorphous semiconductor alloy film deposited onto the substrate 14 will have uniform electrical and optical properties across the substrate 14. Such an arangement is advantageous when using gases such as, for example, silicon tetrafluoride and germane, or silicon tetrafluoride and germanium tetrafluoride wherein the silicon compounds and germanium compounds have different disassociation energies and consequently would otherwise result in a deposited film which exhibits a compositional non-uniformity in the direction of feed gas flow across the substrate.

Figure 9:
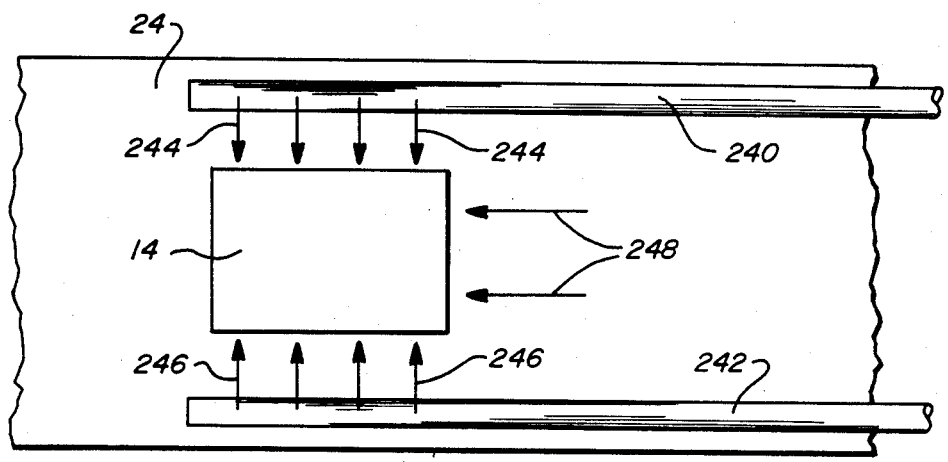
FIG. 9 is a partial top plan view of a free radical distribution system for the apparatus of FIG. 1 in accordance with another embodiment of the present invention.

Referring now to FIG. 9, there is illustrated a system of feeding into the plasma atomic fluorine and/or hydrogen which have been separately generated. The system includes a pair of conduits 240 and 242 which extend into the chamber 24 on opposite sides of the substrate 14. The conduits 240 and 242 are substantially equally spaced from the substrate and include outlets in the vicinity of the substrate for evenly distributing atomic fluorine and/or hydrogen (indicated by arrows 244 and 246) into the plasma over the substrate 14. The atomic fluorine and/or hydrogen can then react with the semiconductor free radicals within the plasma disassociated from the semiconductor containing gases 248 fed into the chamber 24 through inlets 46 (not shown). The atomic fluorine and/or hydrogen and the semiconductor free radicals react to form a film on the substrate. As a result, the system of FIG. 9 provides separate control over the free radicals within the plasma to enable selective incorporation of desired species into the plasma from which the film is deposited.

Other free radicals can of course be introduced by adding additional conduits. For example, free radicals of boron can be introduced to provide substitutional doping within the deposited film to form an improved p-type alloy. Such an alloy is particularly useful in making photovoltaic devices.

Figure 10:
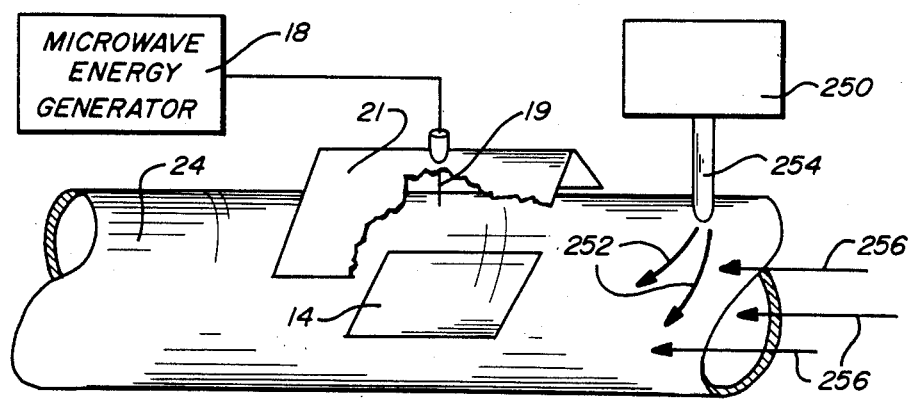
FIG. 10 is a partial perspective view of another microwave plasma deposition system in accordance with a still further embodiment of the present invention.

Referring now to FIG. 10, there is illustrated another microwave deposition in accordance with a further embodiment of the invention. In this system a free radical generator 250 including "Woods Horn" 254 known in the art is used to feed selected free radicals 252 into the chamber 24. Of course, additional generators 250 can be provided. A microwave source as in FIG. 1 can be provided including a microwave generator 18, an antenna 19, and a reflective housing 21. The generator 18 can provide the free radical generator 250 with microwave energy, or the free radical generator 250 can include its own source of microwave energy.

The free radicals 252 react with the reactive species formed within the plasma from the reaction gases 256 to form a film on the substrate 14. Hence, as in the previous embodiment, selected free radicals can be introduced into the plasma at will to form new and improved amorphous semiconductor alloys.

The atomic fluorine and/or hydrogen within the plasma provides amorphous semiconductor alloys having improved structural and chemical properties. Infrared spectroscopy shows a significant silicon-fluorine peak in the alloys indicating that the fluorine is bonding to the silicon in a preferred manner providing material stability and reduced density of states. This is of particular importance in the fabrication of photovoltaic devices.

As previously mentioned, the alloy layers other than the intrinsic alloy layer can be other than amorphous layers, such as polycrystalline layers. (By the term "amorphous" is meant an alloy or material which has long range disorder, although it may have short or intermediate order or even contain at times some crystalline inclusions.)

Modifications and variations of the present invention are possible in light of the above teachings. It is therefore, to be understood that within the scope of the appended claims the invention may be practiced otherwise than as specifically described

What is claimed and desired to be secured by Letters Patent of the United States is:

1. A process for depositing semiconductor alloy films onto a substrate, comprising:
   providing at least a first source of energy;
   providing a substantially enclosed reaction vessel containing the substrate;
   evacuating the reaction vessel to a pressure below atmospheric;
   providing at least a first gaseous mixture including a semiconductor-containing reaction gas;
   activating the energy source to form free radicals, including a first group of desired free radicals, from the first gaseous mixture;
   providing separate control over the free radicals;
   selectively incorporating the first group of desired free radicals into a semiconductor alloy film deposited onto the substrate at high deposition rates with high gas conversion efficiencies and without any significant powder or polymeric inclusions.

2. A process as in claim 1, wherein the gaseous mixture is activated at a location remote from the substrate and the first group of desired free radicals are operatively disposed relative to the substrate for deposition thereupon.

3. A process as in claim 1 wherein the gaseous mixtures are activated adjacent the substrate for deposition thereupon.

4. A process as in claim 1 wherein the first energy source is microwave.

5. A process as in claim 1 wherein a plurality of sources of energy is provided.

6. A process as in claim 5 wherein each of the plurality of sources is adapted to form the first group of desired free radicals.

7. A process as in claim 5 wherein additional gaseous mixtures differing from the first gaseous mixture are provided; and
   each of the additional gaseous mixtures being operatively associated with at least one of the plurality of sources other than the first source.

8. A process as in claim 7 wherein the first gaseous mixture includes Si for forming selected Si free radicals;
   a second gaseous mixture includes H for forming H free radicals; and
   the Si and H free radicals being discretely introduced adjacent the substrate.

9. A process as in claim 8 wherein the first gaseous mixture further includes fluorine for forming selected fluorinated Si free radicals.

10. A process as in claim 7, wherein the first gaseous mixture includes Si for forming selected Si free radicals;
    a second gaseous mixture includes F for forming the F free radicals; and
    Si and F free radicals being discretely introduced adjacent the substrate.

11. A process as in claim 10 wherein the first gaseous mixture further includes H for forming selected hydrogenated Si free radicals.

12. A process as in claim 7, wherein the first gaseous mixture includes Ge for forming selected Ge free radicals;
    a second gaseous mixture includes H for forming H free radicals; and
    the Ge and H free radicals being discretely introduced adjacent the substrate.

13. A process as in claim 12 wherein the first gaseous mixture further includes F for forming selected fluorinated Ge free radicals.

14. A process as in claim 7 wherein the first gaseous mixture includes Ge for forming selected Ge free radicals;
    a second gaseous mixture includes F for forming F free radicals; and
    the Ge and F free radicals being discretely introduced adjacent the substrate.

15. A process as in claim 14 wherein the first gaseous mixture further includes H for forming selected hydrogenated Ge free radicals.

16. A process as in claim 7 wherein the first gaseous mixture includes Ge and Si for forming selected Ge:Si free radicals;
    a second gaseous mixture includes H for forming H free radicals; and
    the Ge:Si and H free radicals being discretely introduced adjacent the substrate.

17. A process as in claim 16 wherein the first gaseous mixture further includes F for forming selected fluorinated Ge:Si free radicals.

18. A process as in claim 7 wherein the first gaseous mixture includes Ge and Si for forming selected Ge:Si free radicals;
    a second gaseous mixture includes F for forming F free radicals; and
    The Ge:Si and F free radicals being discretely introduced adjacent the substrate.

19. A process as in claim 18 wherein the first gaseous mixture further includes H for forming hydrogenated Ge:Si free radicals.

20. A process as in claim 4 wherein the reaction vessel is evacuated to a pressure of about 0.001 to 0.1 torr.

21. A process as in claim 7 wherein at least one of the additional gas mixtures includes a dopant for forming selected dopant-containing free radicals.

22. A process as in claim 7 wherein at least one of the additional gas mixtures includes a band gap adjuster for forming selected band gap adjuster-containing free radicals.

23. A process as in claim 1 wherein each of the at least one energy source is a free radical generator.

* * * * *